United States Patent
Luque-Lopez et al.

(10) Patent No.: US 6,444,897 B1
(45) Date of Patent: Sep. 3, 2002

(54) INTERMEDIATE BAND SEMICONDUCTOR PHOTOVOLTAIC SOLAR CELL

(75) Inventors: Antonio Luque-Lopez; Fernando Flores-Sinta; Antonio Martí-Vega; José Carlos Conesa-Cegarra; Perla Wahnon-Benarroch; José Ortega-Mateo; Cesar Tablero-Crespo; Rubén Pérez-Pérez; Lucas Cuadra-Rodríguez, all of Madrid (ES)

(73) Assignees: Universidad Politecnica de Madrid, Madrid (ES); Universidad Autonoma de Madrid - Fac. Ciencias, Madrid (ES); Consejo Superior de Investigaciones Cientificas, Madrid (ES)

( * ) Notice: Subject to any disclaimer, the term of this patent is extended or adjusted under 35 U.S.C. 154(b) by 0 days.

(21) Appl. No.: 09/762,438
(22) PCT Filed: Jun. 9, 2000
(86) PCT No.: PCT/ES00/00209
§ 371 (c)(1), (2), (4) Date: Feb. 8, 2001
(87) PCT Pub. No.: WO00/77829
PCT Pub. Date: Dec. 21, 2000

(30) Foreign Application Priority Data

Jun. 9, 1999 (ES) ................................................ 9901278

(51) Int. Cl.$^7$ ............................................. H01L 31/06
(52) U.S. Cl. ................. 136/255; 136/249; 136/252; 136/261; 136/262; 136/256; 257/437; 257/458; 257/461; 257/464; 257/431
(58) Field of Search .................................. 136/255, 249, 136/252, 261, 262, 256; 257/437, 458, 461, 464, 431

(56) References Cited

U.S. PATENT DOCUMENTS

| | | | | |
|---|---|---|---|---|
| 4,688,068 A | * | 8/1987 | Chaffin et al. | 136/249 |
| 5,496,415 A | * | 3/1996 | Barnham | 136/255 |
| 5,851,310 A | * | 12/1998 | Freundlich et al. | 136/255 |

FOREIGN PATENT DOCUMENTS

| | | | |
|---|---|---|---|
| ES | 2102523 | | 8/1994 |
| JP | 62-128182 A | * | 6/1987 |
| JP | 6-163962 A | * | 6/1994 |
| JP | 6-302840 A | * | 10/1994 |
| JP | 09 237908 | | 9/1997 |
| JP | 9-237908 A | * | 9/1997 |

OTHER PUBLICATIONS

Patent Abstracts of Japan, abstract for JP 6–302840, Oct. 1994.

* cited by examiner

*Primary Examiner*—Alan Diamond
(74) *Attorney, Agent, or Firm*—Clark & Brody

(57) ABSTRACT

The invention relates to a solar cell containing a semiconductor (1) with an intermediate band (2) that is half filled with electrons, located between two layers of ordinary n type (3) and p type (4) semiconductors. When lighted, electron-hole pairs are formed either by a photon that absorbs the necessary energy (5) or by two photons (6,7) that absorb less energy which pump an electron from the valence band to the intermediate band (8) and from the latter to the conductance band (9). An electrical current is generated that exits on the p side and returns via the n side. The n and p layers also prevent the intermediate band from contacting the outer metal connections, which would have resulted in a short-circuit. Said cell converts solar energy into electricity in a more efficient manner than conventional cells and contributes to improvement of the photovoltaic devices.

34 Claims, 7 Drawing Sheets

INTERMEDIATE BAND SEMICONDUCTOR PHOTOVOLTAIC SOLAR CELL

SUBJECT

A solar cell able to convert solar energy into electricity is described, based on a new operative principle capable of obtaining efficiency superior to that obtained with the present solar cells. Therefore, this invention pertains to the scope of manufacturing semiconductor devices for electronic use and, more specifically, to the manufacture of solar cells.

The cell, as described in FIG. 1, contains a semiconductor (1) with an intermediate band (2) half filled with electrons, located between two ordinary, n type (3) and p type (4), semiconductor layers. On lighting up electron-hole pairs are created, either by absorption of a photon with the required energy (5) or by the absorption of two (6,7) with less energy that pump an electron from the valence band to the intermediate band (8) and from this to the conduction band (9). A flow of electrons exits mainly through the n type (3) semiconductor and a flow of holes through the p type (4); thus an electric current that exits through the p side and returns through the n side is established. The n type (3) and p type (4) layers also prevent the intermediate band (2) from coming into contact with the external metallic connections, which would cause a short-circuit.

PRIOR STATE OF THE ART

Solar cells, as they are today, are manufactured with a semiconductor and are based on the following operative principle: The photons of the light, on falling on the solar cell, are absorbed by it and yield their energy to the valence electrons of the semiconductor and tear them from the bonds that maintain them joined to the cores of the atoms, promoting them to a superior energetic state called conduction band in which they can move easily through the semiconductor. At the same time, the holes left by the yielded electrons can jump from core to core, thus forming a second type of charge carrier, this time positive, that located in the valence band can also move easily.

In this way, each photon usefully absorbed causes or generates an electron-hole pair. There are a series of mechanisms through which a broken bond can be reconstructed, resulting in what is called a recombination of an electron-hole pair.

Operation of the solar cells can be explained using the following balance arguments. Thus, in the case of the conduction band, the difference between the number of electrons generated by time unit less the number of those recombined must equal the electrons going out of said band as current—incoming if what is outgoing are electrons—from an external circuit. Likewise, the difference between generations and recombinations equals the holes that go out of the valence band as current, in this case outgoing current.

So that the solar cell operates properly, one of the faces must be made in such a way that nearly all of what leaves it are electrons and the other so that nearly all of what leaves it are holes. This is obtained by the procedure of doping the semiconductor next to one of the faces of the solar cell with donnor impurities, able to produce electrons in the conduction band, so that there is a high concentration of electrons in this region—n type region—whilst the semiconductor next to the other face is doped with acceptor impurities, able to produce holes in the valence band, so that there is a high concentration of holes in that region—p type region.

The abundance of majority carriers, electrons in the n region and holes in the p, reduces that of minority carriers, holes in the n region and electrons in the p. In this way, almost only electrons can leave through the n region as there are hardly any holes, whilst only holes can leave through the p region as there are hardly any electrons. Therefore, with the solar cell illuminated, electrons leave through its n face and holes through its p face or, what is the same, a current leaves through the p face and enters through the n face.

A very important concept in the solids is the Fermi level. This is an energetic level at which the quantum states contain an electron at absolute zero. Above this level the states are empty. At temperatures different from absolute zero, in a semiconductor that is not excessively doped, the following important ratios are fulfilled:

$$n = N_c \exp[(E_F - E_c)/kT] \qquad (E1)$$

$$p = N_v \exp[(E_v - E_F)/kT] \qquad (E2)$$

where n and p are the concentration of electrons and holes, respectively, in the semiconductor, $N_C$ and $N_V$ are characteristic constants of the used semiconductor, depending on the temperature, k is the Boltzmann constant, T is the absolute temperature of the semiconductor, $E_C$ and $E_V$ are the energetic levels of the minimum of the conduction band and the maximum of the valence band, respectively, and, lastly, $E_F$ is the Fermi level. It should be noted that the np product, at a given temperature, is a constant called $n_i^2$. Use has been made of this fact on indicating that the regions with many electrons have few holes and vice versa.

These equations reveal that the Fermi level is found near the end of the conduction band in n type semiconductors with many electrons and near the top of the valence band in p type semiconductors with many holes.

On the other hand, the Fermi level has a very important thermodynamic meaning as it represents the chemical potential of the electrons in the solid, with the current proportional to its gradient. As regards a semiconductor in thermal equilibrium, in which there are no currents, the Fermi level must have a zero gradient, that is, it must be constant throughout the semiconductor.

Under illumination, the electrons and holes are more abundant and the np product becomes greater than in balance. In this case, the Fermi level is separated into two Fermi pseudo-levels, one, $E_{Fn}$, for the electrons and the other, $E_{Fp}$, for the holes. Using the previous formulas it is easy to see that:

$$np = n_i^2 \exp[(E_{Fn} - E_{Fp})/kT] \qquad (E3)$$

The separation of the Fermi pseudo-levels, dragging with them the band in which the carrier to which they refer is majority, causes a noticeable modification in the potential difference and, therefore, in the electric field which noticeably decreases. This potential variation is reflected in the potential difference that appears in the terminals of the solar cell, given by the difference of the Fermi pseudo-levels of the electrons on face n and the holes on face p, with the sign changed, in other words, face p becomes positive with respect to face n.

The main parts of a solar cell are: the emitter or upper n region, the base or lower p region, the rear metallic contact and the upper metallic contact in the form of a grid to let the light through.

An inconvenience of the solar cells is that they do not completely convert the energy of the photons they receive into electric energy. In fact, to start, the solar cell can only make use of the photons with energy exceeding that of the forbidden band $E_G = E_C - E_V$, or the distance that separates the energy minimum of the conduction band from the maximum energy level of the valence band. For photons with more energy, they also fail to the best use of the excess energy provided by the photon. In conclusion, the photons made the best use of are those with energy near $E_G$. For this reason, solar cells in tandem are used.

The tandem cells are made up of two or more cells with different $E_G$ values placed one on top of the other in a descending $E_G$ so that the one with more $E_G$ is on the top. These cells are connected in series, usually by a tunnel junction that provides a good ohmic contact among them. These junctions are such that, due to their high doping, form such a high electric field that the semiconductor is perforated electrically, resulting in a good current conduction.

The efficiency with tandem cells is potentially greater than with cells of one semiconductor only, and it is in practice when the tandem is sufficiently developed.

This invention consists in using a semiconductor with an intermediate band as the source of a new type of cells the efficiency of which exceeds not only the conventional solar cells but also the tandem cells of two semiconductors, all of which are considered as ideal devices.

DESCRIPTION OF THE INVENTION

Figure 1:
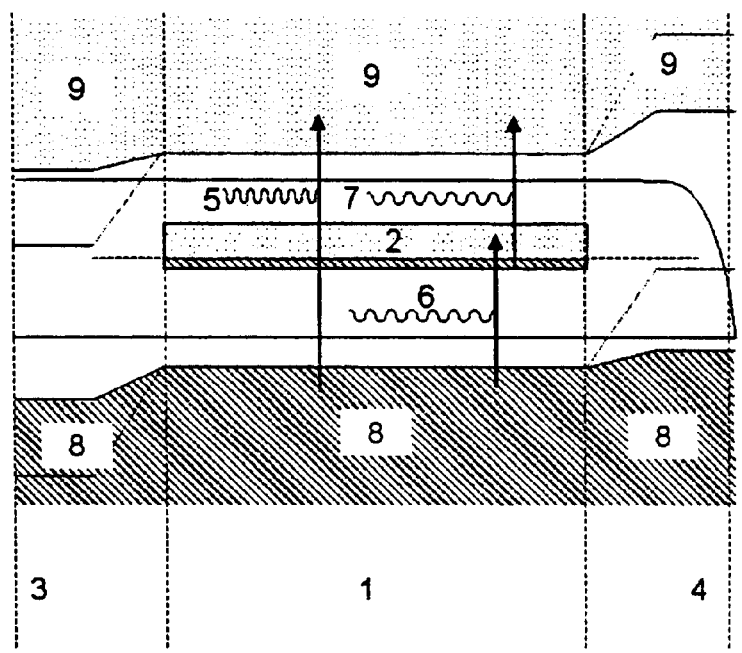
FIG. 1 represents the band diagram of the intermediate band solar cell.
Figure 2:
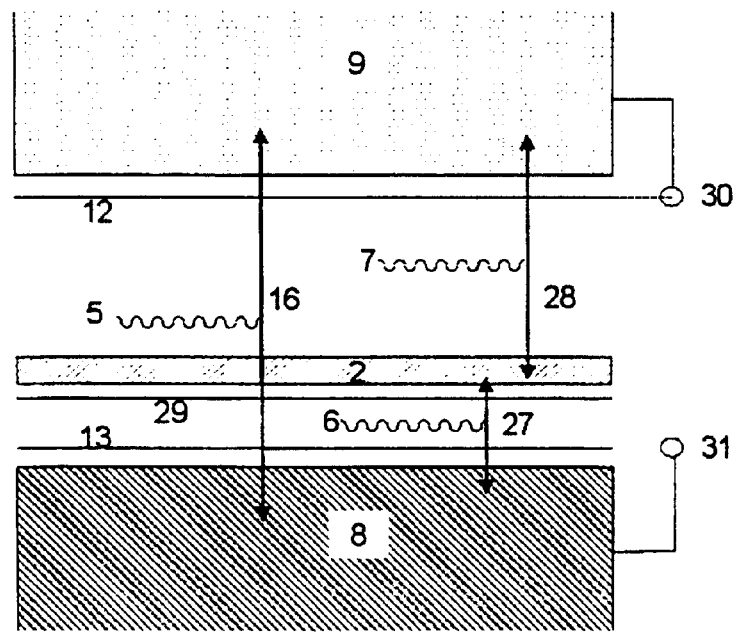
FIG. 2 represents the operating principle of the intermediate band solar cell.

It is assumed that a semiconductor has an intermediate energy band like the one represented with (2) in FIG. 2. It also has, like the ordinary semiconductors, a conduction band (9) and a valence band (8). As in an ordinary semiconductor, the photons (5) can pump (16) electrons from the valence band (8) to the conduction band (9), creating electron-hole pairs. However, there are also photons (6) with less energy that pump (27) electrons from the valence band (8) to the intermediate band (2) and there are also other photons (7) that pump (28) electrons from the intermediate band to the conduction band (9). The concatenation of the pumping processes (27) of electrons from the valence band to the intermediate band and (28) from this to the conduction band complete the generation of an electron-hole pair.

Filling of the conduction n band (9) is caused as the difference between the pumping arising by means of the processes (16) and (28) and the drops through the same processes in the opposite direction. This filling is translated only into a current of electrons extracted by the electrode (30). Likewise, filling of the valence band arises as the difference between t he pumping caused through the processes (16) and (27) and the drops through the same processes in the opposite direction. This filling is translated only into a current of holes extracted by the electrode (31). This is the principle on which the invention is based.

The intermediate band semiconductor photovoltaic solar cell is characterized by the fact that it has a semiconductor with an energy band located on the intermediate position between the valence band and the conduction band, and located between two ordinary semiconductor layers without an intermediate band, one of which is p type and the other n type, that separate the semiconductor with the intermediate band from the electric contacts made in the solar cell to extract the current.

Figure 3:
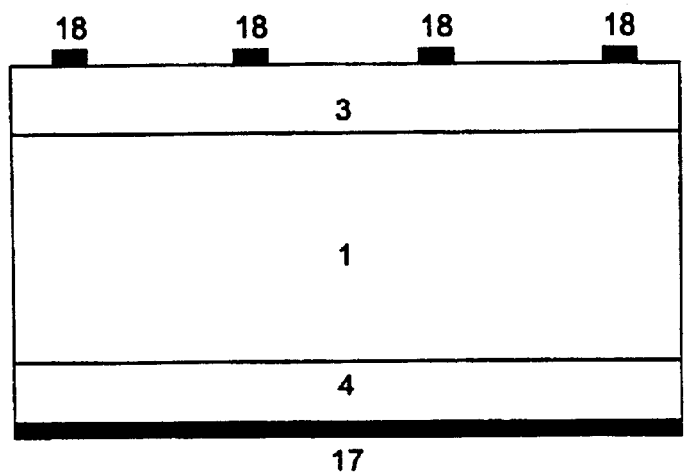
FIG. 3 schematically represents the structure of said cell.

The intermediate band solar cell, purpose of this invention, is shown schematically, in its most simple form, in FIG. 3 where (1) represents the semiconductor with the intermediate band, (3) the n type ordinary semiconductor, (4) the p type ordinary semiconductor. The electric contacts of the face or faces to be illuminated have a grid that lets the light through. These grids could be replaced or reinforced by using a transparent conductor. Specifically, in the case illustrated by FIG. 3, it has been assumed that only one of the faces is illuminated, the front, and therefore the contact (18) in this area has a grid form whilst on the back part an ordinary electric contact (17) is made.

For the purposes of the invention, it is irrelevant that where the p type material has been located the n type material is located and where the n type material has been located the p type material is located.

The previous layers, either due to manufacturing requirements (thin layers) or due to the mere fact of providing the structure with a mechanical stiffness, can be placed on a substrate that serves as a support. This substrate can be a semiconductor. There may also be one or various layers that become adapted to the support, located between this and the ordinary semiconductor layers without intermediate band. It may also be that some of the layers are sufficiently thick (more than 10 microns) to be self-supporting and do not need another layer or layers providing the structure with mechanical stiffness.

A transparent semiconductor layer for the useful radiation may be placed on the ordinary semiconductor layers without intermediate band, in order to decrease the surface recombination rate of the cell, that could be perforated or not by grooves facilitating the contact between the ordinary semiconductor layers and the metallic grid.

An anti-reflecting layer can be placed on the face to be illuminated to improve the efficiency of the solar cell.

To improve the efficiency of the cell, doping may be included in the intermediate band semiconductor, perhaps Zn, B, P, Be Sn or Be, of the p or n type, for example to increase its conductivity or to control the carrier concentration in the intermediate band.

When reference is made to the intermediate band semiconductor, it could be that this consists of a composition of various ordinary semiconductors forming a quantum dot matrix in which the confinement of the electrons gives rise to the appearance of the energy levels with respect to the ordinary semiconductors that cause the appearance of the intermediate band.

Figure 4:
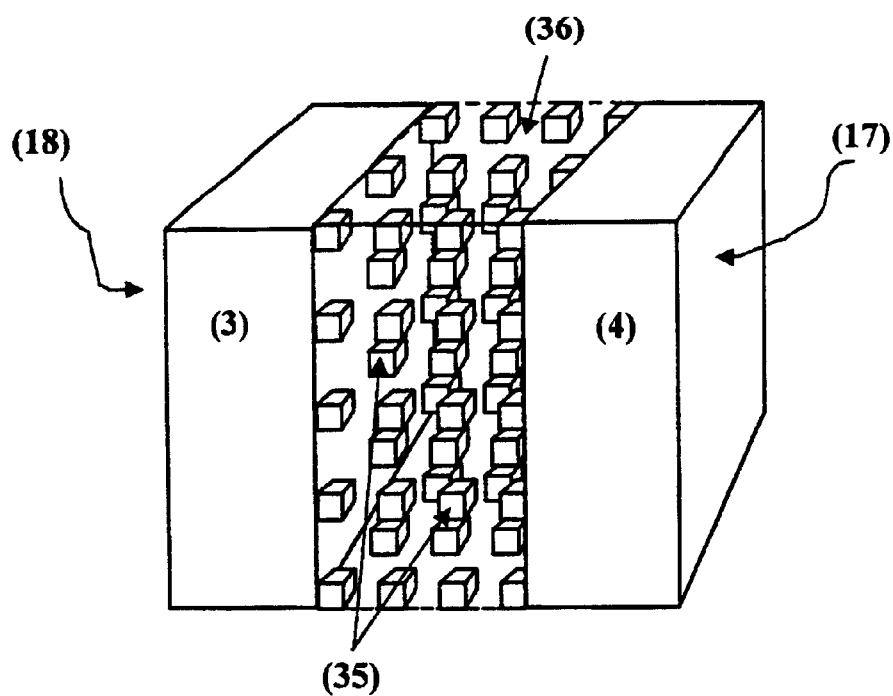
FIG. 4 schematically represents the structure of said cell using quantum dot technology.

The intermediate band solar cell, with the most simple shape, would then be similar to what is shown in FIG. 4, where (35) represents the semiconductor with which the dots are manufactured, (36) the semiconductor material in which they are immersed or barrier material, (3) the ordinary semiconductor region (n), (4) the ordinary semiconductor region (p), (17) the rear contact and (18) the front contact.

The intermediate band solar cell may be grouped with other of the same type or other solar cells to form a tandem of various cells.

Figure 5:
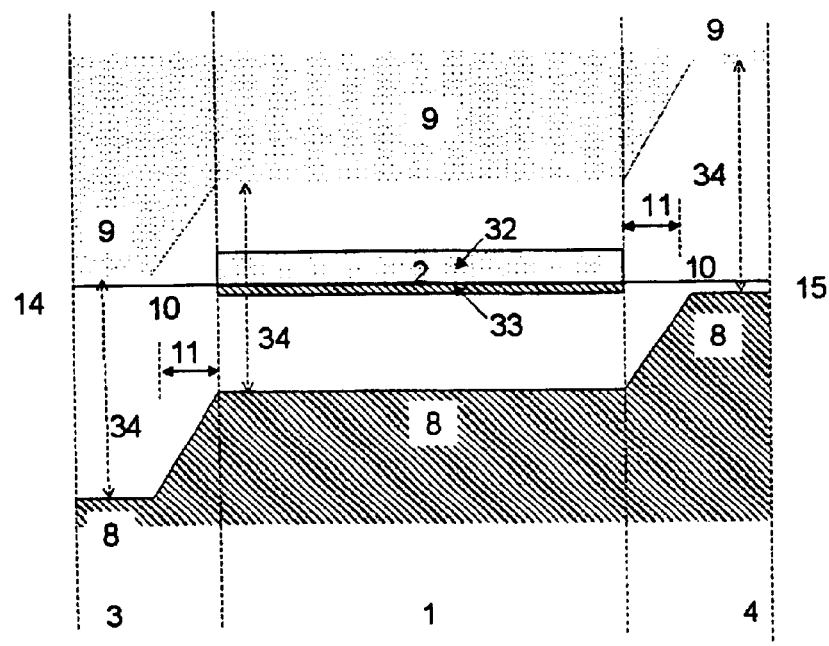
FIG. 5 represents the band diagram of the intermediate band solar cell on equilibrium.

We shall refer to the material with the intermediate band as a base or intermediate band base and to the front and back semiconductors as p or n emitters, according to the case. In FIG. 5, the intermediate band base region is the region indicated by (1) and included between the vertical demarcation stroke lines. The n emitter is the region (3) also included between vertical demarcation stroke lines. The p emitter is the region (4) also included between vertical demarcation stroke lines.

The intermediate band solar cell is characterized by the fact that the intermediate band semiconductor has said band half full with electrons with the Fermi level (10) of the semiconductor located within said band. As is known, the Fermi level, that indicates up to where the possible quantum states for an electron are filled, passes through the intermediate band at absolute zero temperature. The fact that the intermediate band is half filled with electrons gives the corresponding solid certain metallic aspects, as the metals are the ones having half filled bands at absolute zero. In this way, the dotted region (2) would indicate an energy interval in the band almost empty of electrons and the dashed part (33) an energy interval almost full of electrons.

The emitters have the characteristic band diagrams of the ordinary semiconductors. They have a valence band (8) and a conduction band (9). In said diagram the energy difference (34) between the valence band minimum and the conduction band maximum, $E_G$, takes the same value in both emitters and in the base, although this does not have to be necessarily so, as there may be some difference that could be saved with a small discontinuity in the bands located on the borders between base and emitters where there are vertical dotted lines, and, within certain limits, this would not have pernicious effects and may even have beneficial effects.

In thermal equilibrium, in the absence of illumination and external excitation, the Fermi level is unique for all the materials in contact and is horizontal as there is no current flow. This forces the appearance of potential energy differences between the base and both emitters, which can be seen in the figure. In said figure, two space charge zones (11) appear, where the bands slope, caused by minority carrier depletion of the space charge region, leaving positively charged donors in the n emitter and negatively charged acceptors in the p emitter. These charges are compensated by two very thin charge sheets that appear in the base zone, negative as regards the n emitter and positive as regards the p emitter, respectively caused by an excess or defect of electrons of the intermediate band which, as has already been mentioned, have metallic characteristics. The electric fields associated to these space charge zones are what in this device can be attributed the role of charge separator that was attributed to the pn junction in the ordinary solar cells.

Figure 6:
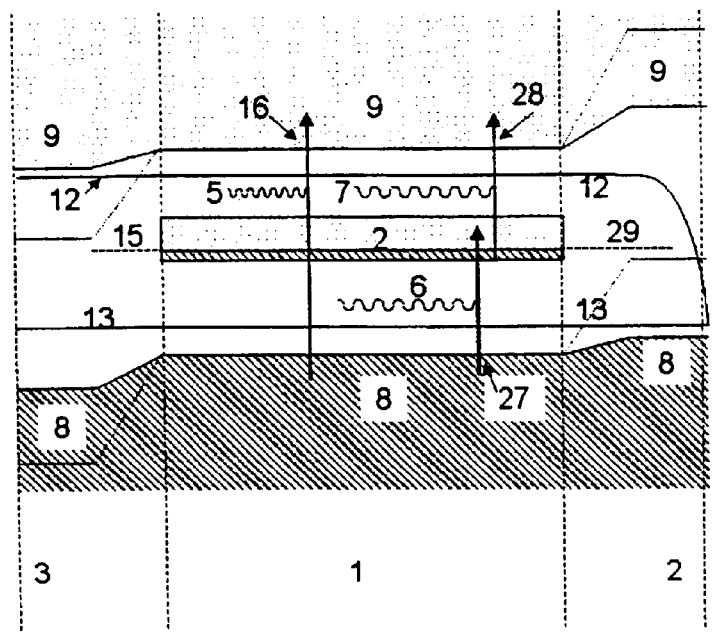
FIG. 6 represents the band diagram of the illuminated intermediate band solar cell.
Figure 7:
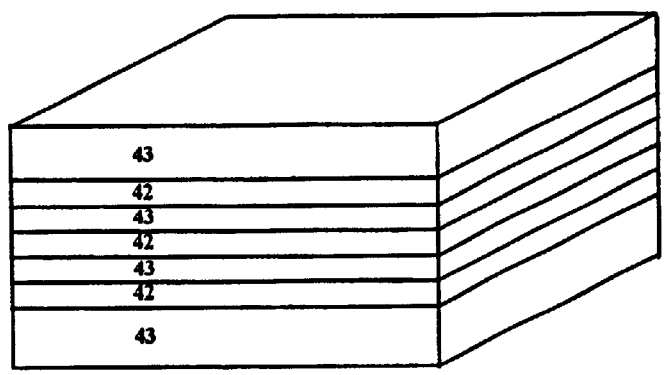
FIG. 7 represents the first step proposed to manufacture the intermediate band solar cell by quantum dot technology.
Figure 8:
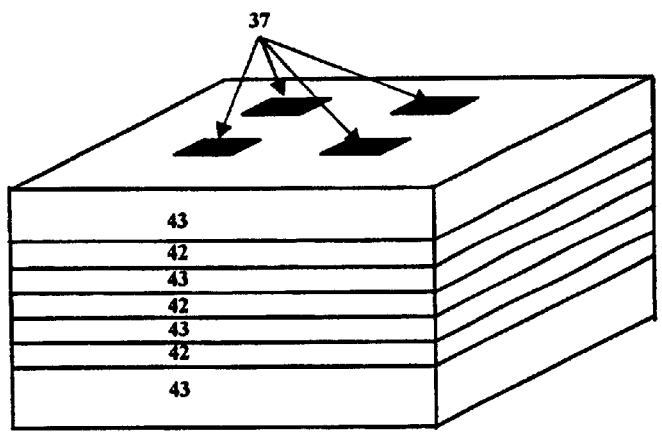
FIG. 8 represents the second step proposed to manufacture the intermediate band solar cell by quantum dot technology.
Figure 9:
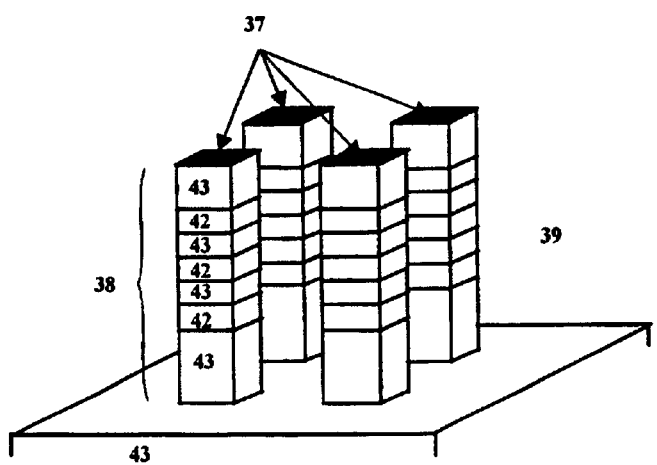
FIG. 9 represents the third step proposed to manufacture the intermediate band solar cell by quantum dot technology.
Figure 10:
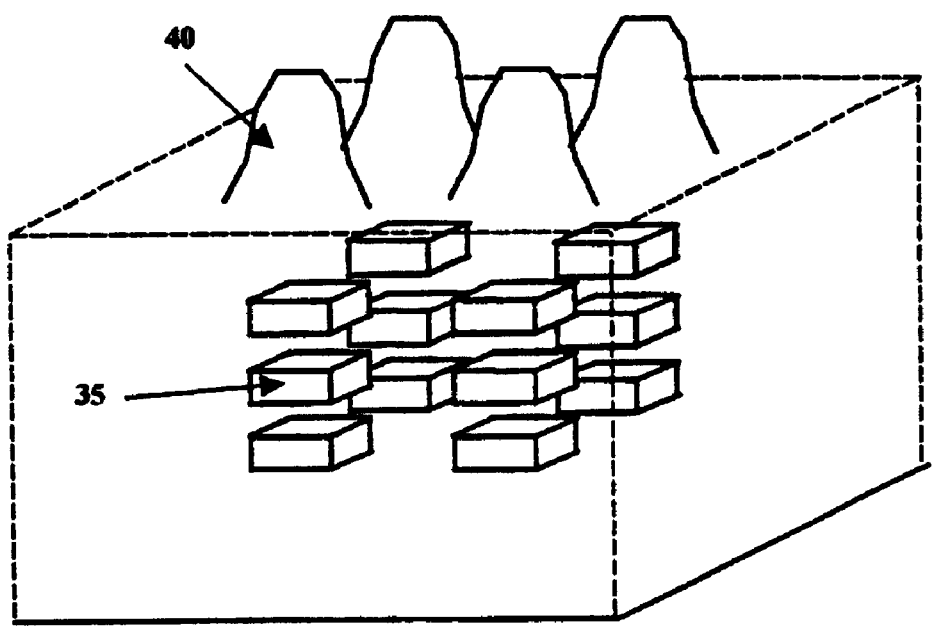
FIG. 10 represents the fourth step proposed to manufacture the intermediate band solar cell by quantum dot technology.

Under illumination (FIG. 6), sufficiently high energy photons, such as the photons (5), are absorbed resulting in transitions (16) from the valence band (8), almost full of electrons—for this reason it is dashed—to the conduction band (9), almost empty—for this reason it is dotted—thus generating electron-hole pairs. This occurs not only in the base but also in both emitters. Furthermore, less energy photons like (6) induce transitions (27) from the valence band to the empty part of the intermediate band; that is, to energy of the band higher than the Fermi level. Likewise, photons such as (7) induce transitions (28) from the full part of the intermediate band; that is, from energy within this band lower than the Fermi level to the almost empty conduction band. The series of absorptions (27) and (28) also produce electron-hole pairs.

In this way, the difference between the electrons that reach the conduction band through the transitions (16) and (28) minus those that disappear through transitions in the opposite direction, that is from the conduction band (9) to the valence band (8) or to the intermediate band (2), must equal the difference of the electrons that leave said band as electric current. But, due to the few electrons in the emitter p (4), nearly all the electrons exit to the exterior circuit through emitter n (3), forming an incoming current. In the same way, the difference between the holes entering the valence band through the transitions (16) and (27) less those that exit through transitions in the opposite direction, that is from the valence band (8) to the conduction band (9) or to the intermediate band (2), must equal the holes that exist from this band as electric current. But, due to the few holes inside the n emitter (3), nearly all the holes leave to the exterior circuit through the p emitter (4) forming an outgoing current.

The way in which the emitter acts as a selective carrier filter has been seen, thus permitting the appearance of a photogenerated electric current.

Under illumination, the Fermi level is separated in three different Fermi pseudo-levels (FIG. 6), one $E_{Fn}$ (12) for the electrons of the conduction band, another $E_{Fp}$ (13) for the holes of the valence band and a third $E_{Fm}$ (29) for the metallic conduction electrons of the intermediate band.

The pseudo-level of the metallic intermediate band does not vary its position as regards said band in spite there is illumination, as occurs in the metals, due to the abundant electrons existing in said band. On the contrary, the Fermi pseudo-levels of electrons and holes do change position as a result of the np product being greater in illumination than in thermal equilibrium. As the equation (E3) is also valid for this case, the result is than $E_{Fn}$ is much greater than $E_{Fp}$. On the other hand, in region (3) of the n emitter, the Fermi level of electrons (12) is very close to the conduction band, as the electrons provided by the donors are abundant. Likewise, in region (4) of the p emitter, the Fermi pseudo-level of holes (13) is very near the valence band, as the holes provided by the acceptors are also abundant. Although this is not visible in most of the figure, now the Fermi pseudo-levels have a small gradient as there are electron and hole currents in the solar cell.

The separation of the Fermi pseudo-levels, dragging with them the band in which the carrier to which they refer is majority, causes a noticeable modification in the potential difference and, therefore, in the electric field appearing in the space charge zones which noticeably decreases. This potential variation is reflected in the potential difference caused in the terminals of the solar cell, given by the difference of the Fermi pseudo-levels of the electrons (12) on face n (14) and the holes (13) on face p (15), its sign being reversed, in other words, face p becomes positive with respect to face n.

The equality of the hole and electron flows leaving the solar cell through the p and n emitters (incoming and outgoing electric currents), respectively, is a result of the void electron balance that enters the intermediate band. So that this balance is maintained, it is essential that there is no contact between said band and the external metallic contacts. If this occurs, the most important consequence would be that the voltage extracted could be void, if contact is made with the two faces, or limited to the separation between one of the Fermi pseudo-levels of electrons and holes and the pseudo-level of the intermediate level, that is much less. It can be seen that the intermediate band remains separated from the metallic contacts by the emitters and this is one of the most important aspects of our invention.

So that this separation is successful, it is convenient that one or the two ordinary semiconductor layers located on both faces of the intermediate band semiconductor layer are double or have a gradual doping, with the external part strongly doped and the internal part without doping or slightly doped. Low doping of the zone near the border with the base is convenient in order to prevent the formation of an electric perforation due to the tunnel effect. At the same time, the high doping on the exterior face of the emitters is convenient to facilitate contact with the connection metals.

In comparison to the ordinary solar cells, this invention produces photocurrent with photons with energy quite less than $E_G$, whilst the voltage is governed by the width of $E_G$. These photons are lost in the ordinary cells without making any use of them. For a given voltage, our invention can generate much more current, or, for a given current the invention gives a higher voltage. The maximum efficiency that the invention could have, in the most ideal case, would be 63.1% as opposed to what a conventional solar cell would have, that is 40.7% or even what a tandem of two junctions, as described above, which would be 55.4%. The reason for the superiority of our invention as opposed to the conventional cell lies in the fact there are photons with energy less than $E_G$ which, in pairs, are taken advantage of to produce external current; the advantage over the tandem of two materials is that in these ones, all the photons that produce current do so in pairs, with one photon absorbed by each of the two materials, whilst in this invention, apart from the current produced by photon pairs, current is also produced by only one photon if this has enough energy.

DETAILS OF PREFERRED EMBODIMENTS

Amongst the possible technologies to manufacture the intermediate band base is the fabrication of quantum dots with the wave functions of the electrons corresponding to the intermediate levels either coupled or not. In this respect, reference is made, in the first place, to FIG. 4. The quantum dots (35) can be manufactured surrounding a semiconductor of a small prohibited band width with another of a larger bandgap (36). In order to reduce the defect density, both semiconductors (35) and (36) should have their crystalline lattices coupled, that is, with the values of their lattice constants very close.

The shape of the "dots" (35) is not relevant. Their volume can have any geometric shape. For example, their shape can be neared by cubes or also by spheres. Their exact size depends on the materials used for their manufacture. However, to give an idea of their sizes, mention should be made that if they are manufactured with III–V materials, characterized by the fact they have an effective mass for the electrons to the order of 0.065 times the mass of the electrons in vacuum, and the quantum dots are neared by spheres, the dots should have an effective diameter of 70 amstrongs. For example, the materials used to manufacture the dots or the material in which they are immersed could be $Ga_xIn_{1-x}As_yP_{1-y}$ and $Al_xGa_{1-x}As_ySb_{1-y}$, where x and y are indices that vary between 0 and 1.

In order to demonstrate the concept, neither the arrangement of the dots in space nor their number by volume unit are important, however these are design aspects to be optimized so that the efficiency of the cell nears its theoretical limit. Thus, the arrangement of the dots does not have to be regular, although this arrangement would probably simplify their study. The arrangement of the dots in space affects the width of the intermediate band that tends to increase as the dots become nearer and, in this case, the specific distribution of states associated to the intermediate band.

In the limit case in which the wave functions of the electrons are not coupled, the intermediate band would be reduced to one energetic level only but with a high degeneration equal to the dot density by volume unit (possibly to the order of $10^{17}$–$5 \times 10^{18}$ cm$^{-3}$), which would be obtained with a separation between dots of about 100 angstroms for the case in which the dots are manufactured with the above mentioned materials.

In the semiconductor composition that gives rise to the quantum dot structure, some doping may be included to improve their properties. Thus for example, it may be necessary to include some type of doping in the dots (35) so that the intermediate band is populated by a number of carriers sufficient to favor the absorption of photons. The semiconductor that surrounds the dots (36) can be doped or not, according to the degree of optimization of the structure, for example, in order to be able to adjust the value of its working function and produce the desired band diagram structure. As has been described above, the set would be included between two ordinary semiconductors, one of the p type (4) and the other of the n type (3) on which the electric contacts (17) and (18) would be made.

Figure 11:
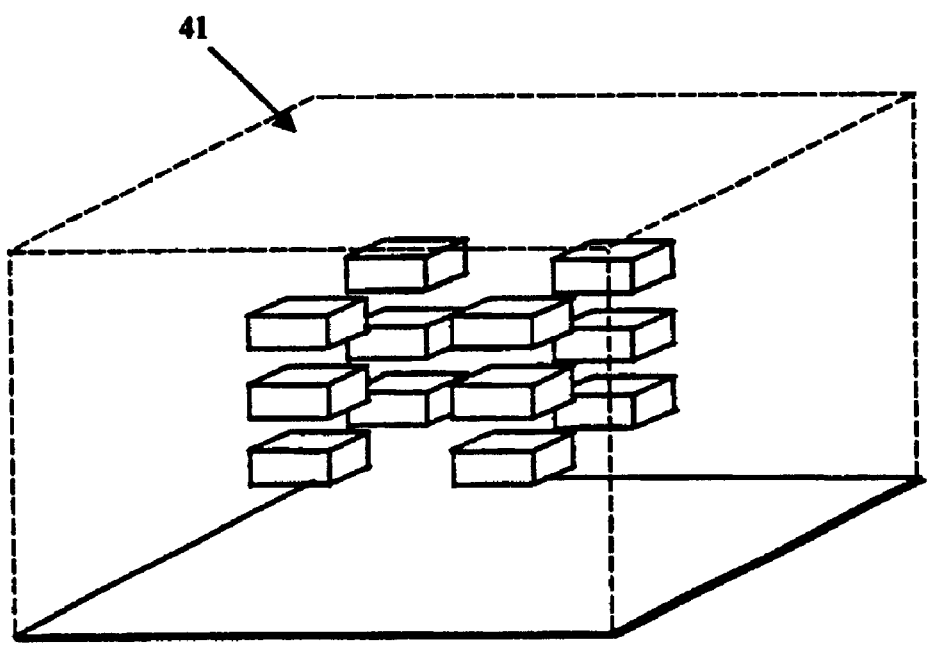
FIG. 11 represents the fifth step proposed to manufacture the intermediate band solar cell by quantum dot technology.
Figure 12:
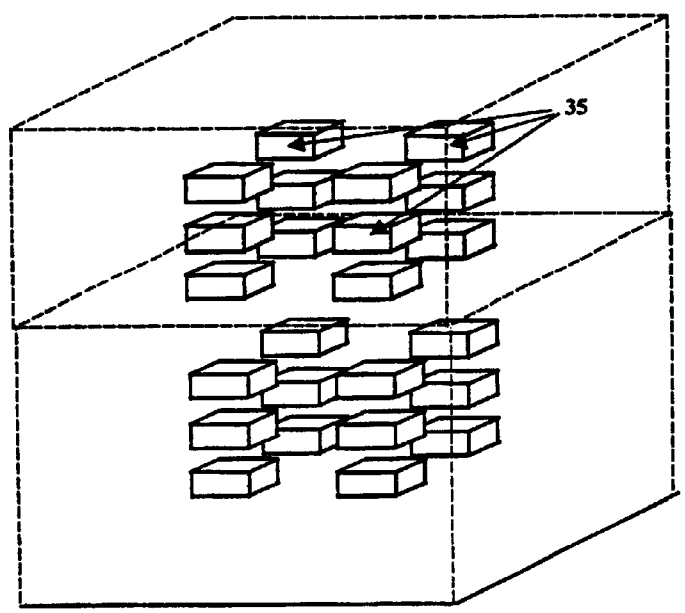
FIG. 12 represents the sixth step proposed to manufacture the intermediate band solar cell by quantum dot technology.

A combination of semiconductor growing techniques by MOCVD or MBE with nanophotolithography techniques, as shown in FIGS. 7 to 12, could be used in the fabrication. Thus, by MOCVD or MBE alternate layers of the semiconductor material (FIG. 7) that must constitute the dot (42) and the material surrounding it would grow. The purpose of placing various layers is to manufacture the greatest number possible of dots with the least number of technological steps. Using nanophotolithography, masks (37) would be placed afterwards (FIG. 8) to define what later must constitute the quantum dots (35). These masks can be of photolithographic resin or any other material that resists the dry etching arising during the subsequent technological process. Subsequently, due to dry etching techniques based on plasmas, known for producing very vertical etching profiles (FIG. 9), columns would be defined (38) that, depending on the starting structure, can contain various alternating layers, or one only, of the material constituting the dot (42) and the material (43) constituting the medium that will surround them or barrier material. Once the nanomasks (37) are removed, the space between columns (39) would be filled with barrier material by MOCVD or MBE techniques. The process would probably result in a wavy surface (40) (FIG. 10) that could be flattened using a chemical etch of the barrier material. The process for obtaining a greater number of dots (35) (FIG. 12) could be repeated on the flattened surface (41) (FIG. 11).

Figure 13:
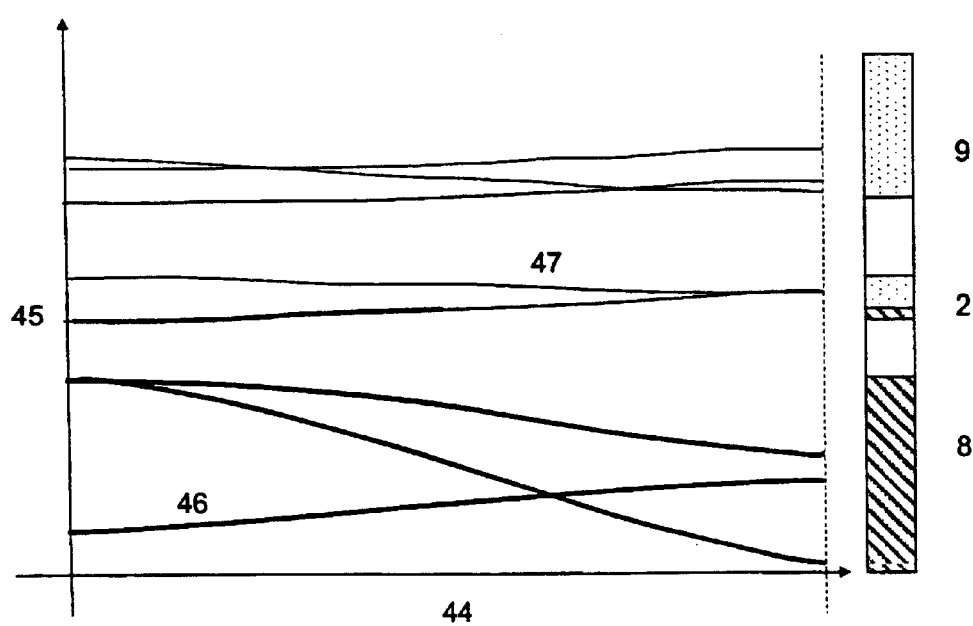
FIG. 13 represents the appearance of an intermediate band by means of an energy band calculation.
Figure 14:
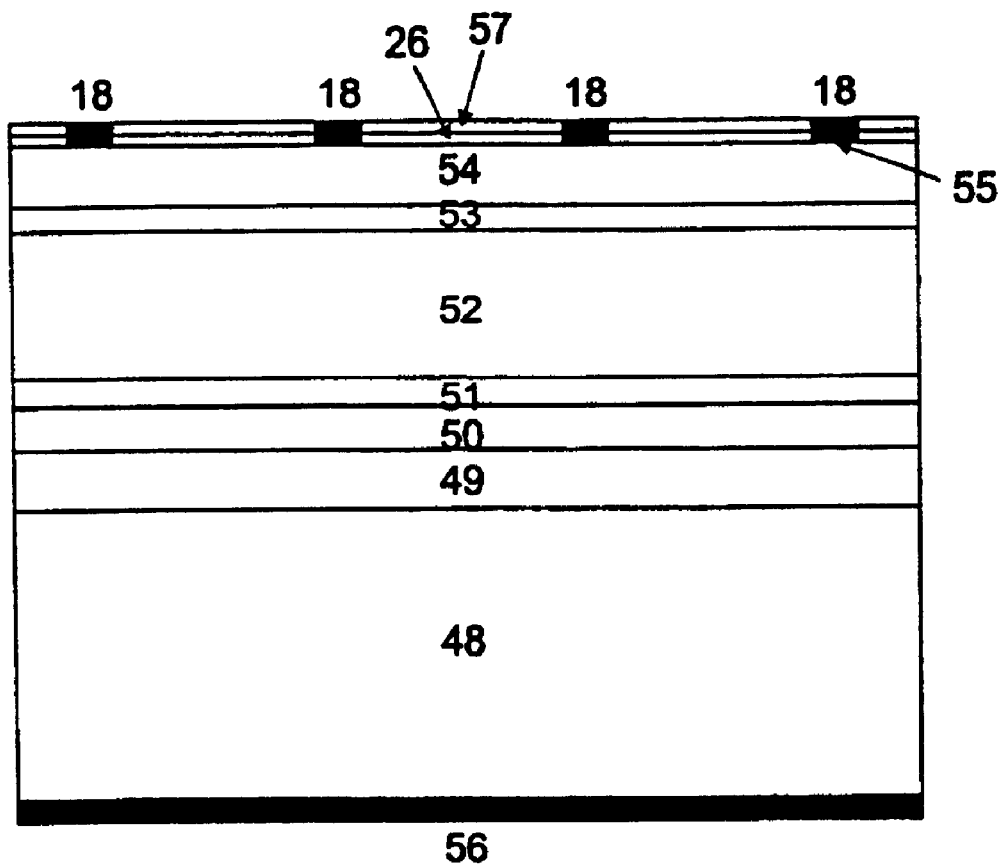
FIG. 14 represents a structure of an intermediate band solar cell with various auxiliary layers.

Other possible technologies would pass through the direct synthesis of some other material. Among the materials able to constitute the intermediate band base are, for example, gallium and germanium phosphoarsenide, $P_xAs_{l-x}Ga_yGe_{l-y}$, where x and y are any index between 0 and 1, inclusive. As an example, FIG. 13 presents the calculation, by the LCAO method, of the $PGa_{0.5}Ge_{0.5}$ bands. In abscissas (44) the reciprocal vector of the crystalline lattice is represented and the energy in ordinates (45). On a thick line (46) the full bands at absolute zero are represented and the empty ones on a thin line (47). A projection of the energy ranges of the bands is represented on the vertical bar to the right, as has been used in the spatial band diagrams of FIGS. 1, 2, 5 and 6. The half filled intermediate band (2), the conduction band (9) and the valence band (8) are shown on said bar.

The two emitters (3) and (4) of this invention are made of an ordinary semiconductor. It is convenient to choose this so that the crystalline lattices of the emitter and of the base are almost equal to avoid the formation of distortions that would cause undesired recombinations. As regards the $E_G$ value in the emitters, this invention includes various kinds, in such a way that it is acceptable either equal, greater or slightly less than that of the base, but certainly not much less as this would reduce the voltage in excess. For this reason, the layers on both faces of the intermediate band semiconductor could be formed by $PGa_xIn_{l-x}$, where x and y are any index between 0 and 1, inclusive.

A good combination could be that the base was $PGa_{0.5}Ge_{0.5}$ and the emitters $PGa_{0.9}In_{0.1}$, with the p emitter doped with Zn and the n emitter with Se. The lattice constant of the GaP is exactly 5.43 Å but with the addition of Ge this is increased to somewhat more than 5.5 Å. The addition of In to the emitter has an effect similar to lattice widening without changing EG, which would be in the range of 2.35 eV for the emitter and slightly higher for the base. However, there is room for variations in the decimal indices that can modify $E_G$ and the crystalline lattice constant in a certain range, as for example a type $P_{0.9}As_{0.3}Ga_{0.5}Ge_{0.5}$ base and a $PGa_{0.8}In_{0.2}$ emitter. That is, there is room for composition adjustments when looking for optimum efficiency.

For manufacturing the invention, it is recommended that the base and emitters are deposited by MOCVD—English initials for Metal-Organic Chemical Vapor Deposition. As regards FIG. 4, the process would be as follows: on a p type $Si_{0.95}Ge_{0.5}$ monocrystalline substratum (48), doped with B grown by the Czochralski method with a lattice parameter close to that of $PGa_{0.9}In_{0.1}$, a p type layer of 3 micrometers, doped with Zn (49), is deposited on an MOCVD reactor, forming a lattice parameter adaptation layer on the rear emitter. Then a $PGa_{0.9}In_{0.1}$ layer of 2 micrometers, strongly doped with Zn (50) is deposited to form the part that must be connected to the rear emitter, followed by a second layer (51) of 1 micrometer of the same material without doping to form the part in which the space charge zone of the mentioned rear emitter is developed.

Then, a layer (52) of 10 micrometers of $PGa_{0.5}Ge_{0.5}$ that forms the intermediate band base is deposited and, on top of it, a layer (53) of 1 micrometer of $PGa_{0.5}Ge_{0.5}$, without doping, so that the space charge zone of the front emitter is formed. On this, a layer (54) of 2 micrometers of n type $PGa_{0.9}In_{0.1}$ doped with Se is deposited to form the zone making contact with the front emitter. Lastly, a layer of AlN is deposited to form a window layer (26) with a large EG and 0.5 micrometers thick which, without preventing the light from passing through, avoids the recombination that would be caused in the free bonds of a bare surface of the front emitter.

Then, after photolithographically outlining some grooves on the window layer, the metallic contacts, tenths of a micrometer thick, are deposited in vacuum, using an Au-Ge alloy for the upper grid, which is photolithographically outlined on the previously mentioned grooves, and an Al and Ag deposit (56) on the back face of the substratum. After this, the contacts are annealed and an anti-reflecting titanium oxide layer (57) by CVD at a low temperature, or a double SZn—$MgF_2$ in vacuum, are deposited. The solar cell is now finished.

The structure that has just been described has many more layers that the three basic structures described in FIG. 3. Not all are necessary in all cases, in fact, a structure with various of the common refinements in high-efficiency solar cells has been presented to mean that such refinements can also be used in the manufacture of this invention. On the other hand, the indicated fabrication procedure, as well as the materials to be used, are not unique, as already indicated, with room for numerous modifications. One of these refers to the possibility of using a transparent conductor, such as SnO or ITO, thus avoiding the upper contact grid and, in part, the anti-reflecting layer.

In the procedure described, it was intended to use Si as substratum. Our photovoltaic solar cell could also be characterized by the fact that the semiconductor substrate was $Si_xGe_{l-x}$, where x is any index between 0 and 1. It would have been more direct to use a $PGa_{0.9}In_{0.1}$ crystal, but it would be more expensive than $Si_{0.95}Ge_{0.5}$, which has the advantage of being manufactured as Si, a largely used material in the electronics industry and, therefore, less expensive. In fact, one of the lateral advantages of the intermediate band cells is they can be manufactured with materials whose lattice parameter is compatible with Si as opposed to the tandems known today for which the cheap substrate compatible is Ge that is much more expensive.

INDUSTRIAL APPLICATION

The described invention is subject to having a wide industrial application, especially in all industrial processes which, in general, are used to manufacture solar cells with the adaptations, for example, that have been described in the section of preferred performances.

Depending on the mechanical properties of the material making up the intermediate band, it could replace the silicon wafers in the industrial manufacture processes of cells of this material. If the material could be manufactured by metal-organic compounds, it could be included in the industrial processes like those used conventionally to manufacture cells of III–V materials, such as gallium arsenide.

As a solar cell, the invention would find immediate application, with a higher efficiency, in all industrial applications of the solar cells: manufacture of photovoltaic modules, obtaining of electric power in autonomous systems, obtaining of electric power in systems connected to the grid, electric supply for small electrical household appliances (clocks, calculators, battery chargers), photovoltaic concentration systems, space satellite electric supply, receivers in teletransmision energy systems, radiation sensors, photovoltaic and photodetector standards.

What is claimed:

1. An intermediate band semiconductor photovoltaic solar cell characterized by the fact that it has a semiconductor with an energy band located in an intermediate position between its valence band and its conduction band, the energy band separated from the valence band and the conduction band by energy gaps, and located between two ordinary semiconductor layers without an intermediate position energy band, one p type and the other n type that separate the intermediate band semiconductor from electric contacts made in the solar cell to extract current.

2. The solar cell, according to claim 1, characterized by the fact that the intermediate band semiconductor is formed by the composition of ordinary semiconductors forming a quantum dot, elements of zero dimensionality, matrix in which the confinement of electrons gives rise to the appearance of new energy levels as regards the ordinary semiconductors that cause the intermediate band to appear.

3. The solar cell, according to claim 2, characterized by the fact that the quantum dots can have any geometric shape.

4. The solar cell, according to claim 2, characterized by the fact that the quantum dots in space and the number of dots per volume unit can be arranged in any way.

5. The solar cell, according to claim 2, characterized by the fact that the material used to manufacture the dots or the material in which the dots are immersed is $Ga_xIn_{1-x}As_yP_{1-y}$ and $Al_xGa_{1-x}As_ySb_{1-y}$, where x and y are indices varying between 0 and 1.

6. The solar cell, according to claim 1, characterized by the fact that the intermediate band semiconductor is gallium and germanium phosphoarsenide, $P_xAs_{1-x}Ga_yGe_{1-y}$, where x and y are any index between 0 and 1, inclusive.

7. The solar cell, according to claim 1, characterized by the fact that the ordinary semiconductor layers on both faces of the intermediate band semiconductor are formed by $PGa_xIn_{1-x}$, where x and y are any index between 0 and 1, inclusive.

8. The solar cell, according to claim 1, characterized by the fact that the intermediate band semiconductor has said intermediate band half filled with electrons.

9. The solar cell, according to claim 1, characterized by the fact that one or two ordinary semiconductors layers located on both faces of the intermediate band semiconductor layer are double layers or contain a gradual doping, with the end part strongly doped and the internal part without doping or slightly doped.

10. The solar cell, according to claim 1, characterized by the fact that the electric contacts on a face or faces to be illuminated have the shape of a grid to let light through.

11. The solar cell according to claim 1, characterized by the fact that the electric contacts are one of a metallic grid, a transparent conductor, or a metallic grid that is reinforced by a transparent conductor.

12. The solar cell according to claim 1, characterized by the fact that one of the ordinary semiconductor layers is sufficiently thick to be self-supporting.

13. The solar cell according to claim 1, characterized by the fact that all the ordinary semiconductor layers are thin but are deposited on a substrate that serves as a support.

14. The solar cell according to claim 13, where the support is a semiconductor.

15. The solar cell, according to claim 13, characterized by the fact that there are one or more layers adapted to be part of the support, the one or more layers positioned between said support and one or more of the ordinary semiconductor layers.

16. The solar cell, according to claim 1, characterized by the fact that a semiconductor layer transparent to useful radiation, which may be perforated or not by grooves facilitating contact between the ordinary semiconductor layers and a metallic grid, is placed on the ordinary semiconductor layers without an intermediate band.

17. The solar cell according to claim 1, characterized by the fact that an anti-reflecting layer is placed on a face to be illuminated.

18. The solar cell, according to claim 1, characterized by the fact that the solar cell can be grouped with other solar cells to form tandem cells.

19. The solar cell, according to claim 1, characterized by the fact that doping selected from tin, phosphorus, boron, zinc or beryllium is included in the intermediate band semiconductor.

20. The solar cell, according to claim 2, characterized by the fact that the ordinary semiconductor layers on both faces of the intermediate band semiconductor are formed by $PGa_xIn_{1-x}$, where x and y are any index between 0 and 1, inclusive.

21. The solar cell, according to claim 2, characterized by the fact that the intermediate band semiconductor has said intermediate band half filled with electrons.

22. The solar cell, according to claim 2, characterized by the fact that one or two ordinary semiconductors layers located on both faces of the intermediate band semiconductor layer are double layers or contain a gradual doping, with the end part strongly doped and the internal part without doping or slightly doped.

23. The solar cell, according to claim 2, characterized by the fact that the electric contacts on a face or faces to be illuminated have the shape of a grid to let light through.

24. The solar cell according to claim 2, characterized by the fact that the electric contacts are one of a metallic grid, a transparent conductor, or a metallic grid that is reinforced by a transparent conductor.

25. The solar cell according to claim 2, characterized by the fact that one of the ordinary semiconductor layers is sufficiently thick to be self-supporting.

26. The solar cell according to claim 2, characterized by the fact that all the ordinary semiconductor layers are thin but are deposited on a substrate that serves as a support.

27. The solar cell according to claim 26, where the support is a semiconductor.

28. The solar cell, according to claim 27, characterized by the fact that the semiconductor substrate is $Si_xGe_{1-x}$, where x is any index between 0 and 1.

29. The solar cell, according to claim 26, characterized by the fact that there are one or more layers adapted to be part of the support, the one or more layers positioned between said support and one or more of the ordinary semiconductor layers.

30. The solar cell, according to claim 2, characterized by the fact that a semiconductor layer transparent to useful radiation, which may be perforated or not by grooves facilitating contact between the ordinary semiconductor layers and a metallic grid, is placed on the ordinary semiconductor layers without an intermediate band.

31. The solar cell, according to claim 2, characterized by the fact that an anti-reflecting layer is placed on a face to be illuminated.

32. The solar cell, according to claim 2, characterized by the fact that the solar cell can be grouped with other solar cells to form tandem cells.

33. The solar cell, according to claim 2, characterized by the fact that doping selected from tin, phosphorus, boron, zinc or beryllium is included in the intermediate band semiconductor.

34. An intermediate band semiconductor photovoltaic solar cell characterized by the fact that it has a semiconductor with an energy band located in an intermediate position between its valence band and its conduction band, the energy band separated from the valence band and the conduction band by energy gaps, and located between two ordinary semiconductor layers without an intermediate position energy band, one p type and the other n type that separate the intermediate band semiconductor from electric contacts made in the solar cell to extract current, characterized by the fact that all the ordinary semiconductor layers are thin but are deposited on a semiconductor substrate that serves as a support and the semiconductor substrate is $Si_xGe_{1-x}$, where x is any index between 0 and 1.

* * * * *